United States Patent [19]
Kim et al.

[11] Patent Number: 6,071,792
[45] Date of Patent: Jun. 6, 2000

[54] METHODS OF FORMING SHALLOW TRENCH ISOLATION REGIONS USING PLASMA DEPOSITION TECHNIQUES

[75] Inventors: Chang-gyu Kim; Min-su Baek; Seok-ji Hong, all of Kyungki-do, Rep. of Korea

[73] Assignee: Samsung Electronics Co., Ltd., Rep. of Korea

[21] Appl. No.: 08/950,325

[22] Filed: Oct. 14, 1997

[30] Foreign Application Priority Data

Apr. 30, 1997 [KR] Rep. of Korea .................. 97-16809

[51] Int. Cl.$^7$ ................................. H01L 21/76
[52] U.S. Cl. ................. 438/424; 438/427; 438/435; 438/437
[58] Field of Search ................... 438/424, 467, 438/438, 437

[56] References Cited

U.S. PATENT DOCUMENTS 5,940,716  8/1999  Jin et al. ............................ 438/424

Primary Examiner—Edward J. Cain
Attorney, Agent, or Firm—Myers Bigel Sibley & Sajovec

[57] ABSTRACT

Methods of forming trench isolation regions include the steps of forming a trench in a semiconductor substrate having a surface thereon and then depositing an electrically insulating layer on the semiconductor substrate, to fill the trench. This depositing step is preferably performed by depositing an electrically insulating layer (e.g., $SiO_2$) using a plasma chemical vapor. A mask layer is then formed on the electrically insulating layer. According to a preferred aspect of the present invention, the mask layer is planarized using chemical mechanical polishing, for example, to define a mask having openings therein that expose first portions of the electrically insulating layer extending opposite the surface. These first portions are also self-aligned to and extend opposite active portions of the substrate. The exposed portions of the electrically insulating layer are then etched using the mask as an etching mask. Then, the mask and second portions of the electrically insulating layer extending opposite the mask, are etched in sequence to define an electrically insulating region in the trench. This latter etching step is preferably not performed using a chemical mechanical polishing step to limit the likelihood of isolation deterioration caused by the dishing phenomenon.

11 Claims, 3 Drawing Sheets

METHODS OF FORMING SHALLOW TRENCH ISOLATION REGIONS USING PLASMA DEPOSITION TECHNIQUES

FIELD OF THE INVENTION

The present invention relates to methods of forming integrated circuits, and more particularly to methods of forming electrical isolation regions in integrated circuit substrates.

BACKGROUND OF THE INVENTION

A LOCal Oxidation of Silicon (LOCOS) method is widely used as an isolation method in semiconductor device fabrication. However, the LOCOS method may limit the quality of the electrical characteristics of semiconductor devices and high-integration, because it is typically susceptible to bird's beak phenomenon caused by lateral oxidation, crystalline defects in a silicon substrate caused by buffer layer stress, and redistribution of impurities ion-implanted for channel stop regions.

In order to avoid the above problems of the LOCOS method, shallow trench isolation (STI) methods have been proposed. In STI methods, a semiconductor substrate is typically etched to form a trench and the trench is then buried with an insulating material, and then chemical-mechanical polishing (CMP) is performed to form an isolation layer. In the STI method, the isolation layer may be formed without using a thermal oxidation step as in LOCOS, so that the adverse effects of the LOCOS method caused by thermal oxidation can be limited, and isolation layers appropriate for high integration can be formed.

However, in the conventional STI method, since the isolation layer is formed by a final chemical-mechanical polishing (CMP) step, a dishing phenomenon typically occurs and may cause the center of a trench isolation region to become concave. Dishing deteriorates the isolation characteristics of the trenches and generates poor planarization of adjacent active regions and layers subsequently formed thereon.

SUMMARY OF THE INVENTION

It is therefore an object of the present invention to provide improved methods of forming trench isolation regions in semiconductor substrates.

It is another object of the present invention to provide methods of forming trench isolation regions which are less susceptible to isolation deterioration caused by the dishing phenomenon.

These and other objects, advantages and features of the present invention are provided by methods of forming trench isolation regions that include the steps of forming a trench in a semiconductor substrate having a surface thereon and then depositing an electrically insulating layer on the semiconductor substrate, to fill the trench. This depositing step is preferably performed by depositing an electrically insulating layer (e.g., $SiO_2$) using a plasma chemical vapor. A mask layer is then formed on the electrically insulating layer. According to a preferred aspect of the present invention, the mask layer is planarized using chemical mechanical polishing, for example, to define a mask having openings therein that expose first portions of the electrically insulating layer extending opposite the surface. These first portions are also self-aligned to and extend opposite active portions of the substrate. The exposed portions of the electrically insulating layer are then etched using the mask as an etching mask. Then, the mask and second portions of the electrically insulating layer extending opposite the mask, are etched in sequence to define an electrically insulating region in the trench. This latter etching step is preferably not performed using a chemical mechanical polishing step to limit the likelihood of isolation deterioration caused by the dishing phenomenon.

According to other preferred aspects of the present invention, the step of forming a mask layer comprises depositing a mask layer comprising polycrystalline silicon. The step of forming a trench also preferably comprises forming a plurality of adjacent trenches in the substrate to define active regions therebetween. In addition, the step of depositing an electrically insulating layer comprises conformally depositing an electrically insulating layer on the surface of the substrate and into the plurality of trenches to fill the trenches. The step of planarizing the mask layer preferably comprises planarizing the mask layer to define a mask having openings therein that extend opposite the active regions.

According to an embodiment of the present invention, the step of forming a trench is preceded by the steps of forming a pad oxide layer on the surface of the substrate, forming a silicon nitride layer on the pad oxide layer, opposite the surface, forming a spin-on glass layer on the silicon nitride layer, opposite the pad oxide layer, and patterning the spin-on glass layer, silicon nitride layer and pad oxide layer to expose the surface of the substrate.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 1:
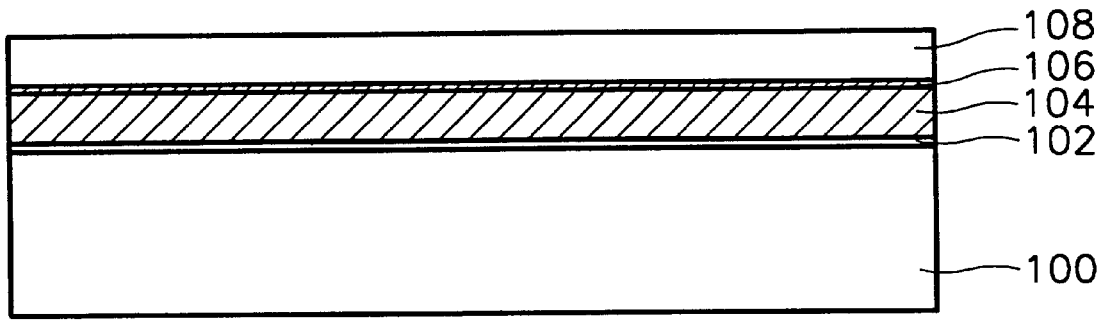
FIGS. 1–10 are cross-sectional views of intermediate structures that illustrate a preferred method of forming trench isolations regions in semiconductor substrate according to an embodiment of the present invention.

FIG. 1 shows a step of sequentially forming a pad oxide layer 102, a first insulating layer 104, a second insulating layer 106 and a third insulating layer 108. The pad oxide layer 102 may be formed to a thickness of approximately 110 Å. Next, the first insulating layer 104, for example, a nitride layer, is formed on the pad oxide layer 102 to a thickness of approximately 2000 Å. Sequentially, the second insulating layer 106, for example, a spin-on-glass (SOG) layer, is formed on the first insulating layer 104 to a thickness of approximately 700 Å. Then, the third insulating layer 108, for example, an insulating layer selected from a group consisting of a polymer layer, a plasma TEOS (tetraethyl-orthosilicate) layer, an oxide layer and a composition thereof, is formed on the second insulating layer 106 to a thickness of approximately 2500 Å.

Figure 2:
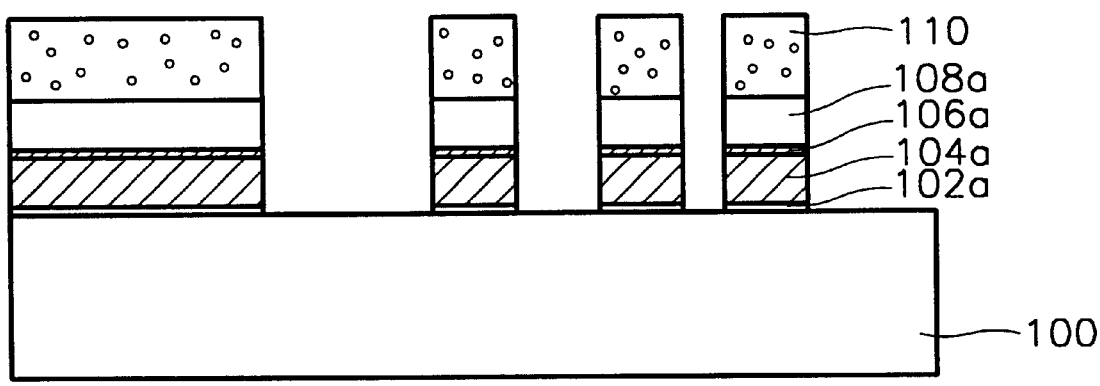

FIG. 2 shows a step of forming a third insulating layer pattern 108a, a second insulating layer pattern 106a, a first insulating layer pattern 104a and a pad oxide layer pattern 102a. In particular, a photoresist pattern 110 is formed on the third insulating layer 108 using a photolithography process. Then, the third insulating layer 108, the second insulating layer 106, the first insulating layer 104 and the pad oxide layer 102 are sequentially etched using the photoresist pattern 110 as a mask, to form the third insulating layer pattern 108a, the second insulating layer pattern 106a, the first insulating layer pattern 104a and the pad oxide layer pattern 102a, and expose those portions of the semiconductor substrate 100 where trench isolation regions are to be subsequently formed. Then, the photoresist pattern 110 used as a mask is removed.

Figure 3:
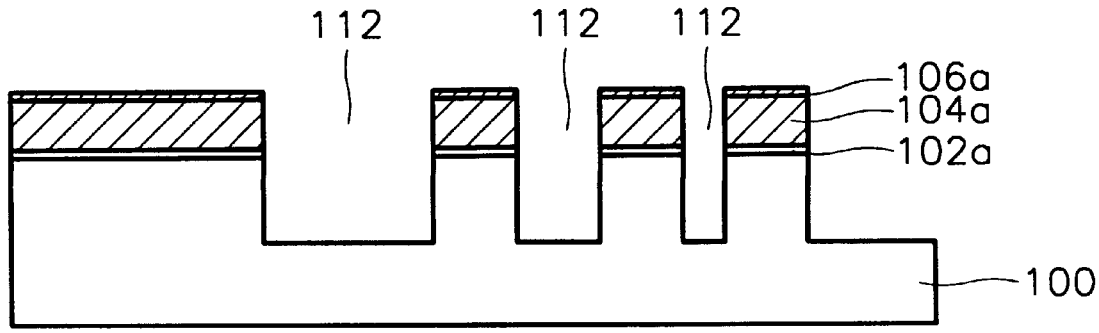

FIG. 3 shows a step of forming trenches 112 by etching the substrate 100. At this time, the third insulating layer pattern 108a, the second insulating layer pattern 106a, the first insulating layer pattern 104a and the pad oxide layer pattern 102a are used as a mask pattern for the etching. During etching, the third insulating layer pattern 108a of the mask pattern may also be consumed and removed when the trenches 112 are formed.

Figure 4:
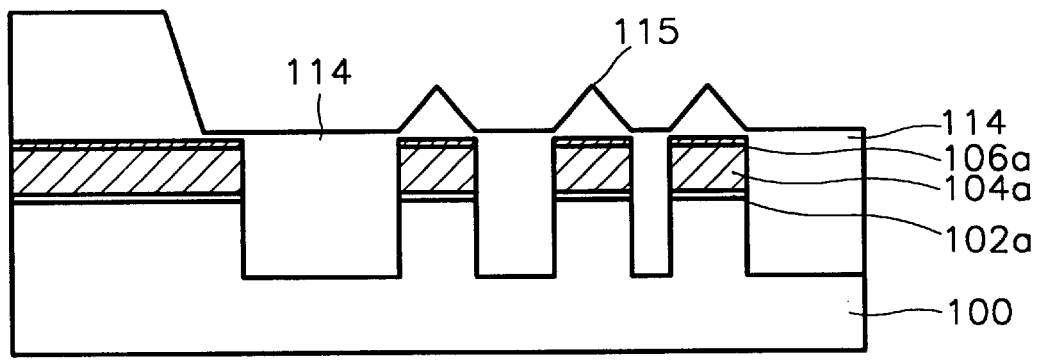

FIG. 4 shows a step of forming a fourth insulating layer 114. Here, the fourth insulating layer 114 is preferably formed on the entire surface of the semiconductor substrate 100 where the trenches 112 are formed, by a plasma chemical vapor deposition (CVD) method in which deposition and etching processed are concurrently performed. For the plasma CVD method, high density plasma (HDP) or electron cyclotron resonance (ECR) plasma can be employed. According to the plasma CVD method, when an insulating layer is formed using HDP plasma or ECR plasma, a negative voltage is applied to the substrate 100 and a plasma gas, for example, argon gas, is exposed to the substrate 100, so that of deposition and etching of the insulating layer is concurrently performed. The fourth insulating layer 114 formed by the above-described method has excellent trench burial characteristics. During this CVD method, triangular-shaped protrusions 115 may be formed on the second insulating layer pattern 106a.

Figure 5:
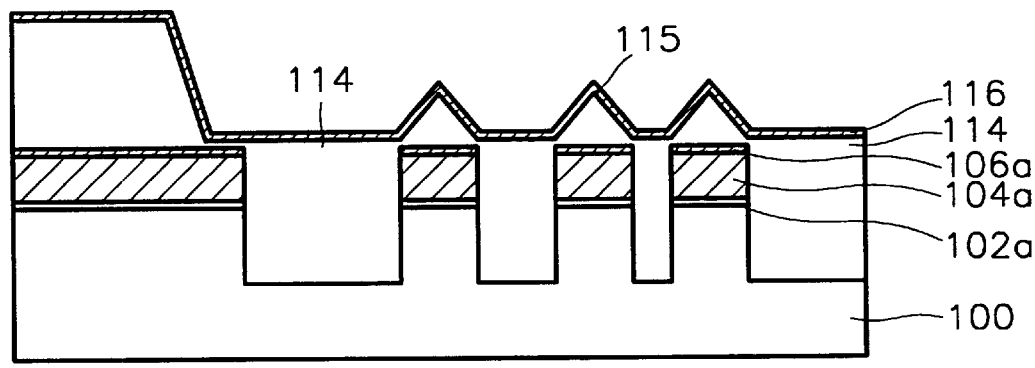

FIG. 5 shows a step of forming a mask layer 116. Here, the mask layer 116, for example, a polysilicon layer, is formed on the fourth insulating layer 114 to a thickness of approximately 1500 Å. The mask layer 116 is used for etching the fourth insulating layer 114, as illustrated by FIG. 7.

Figure 6:
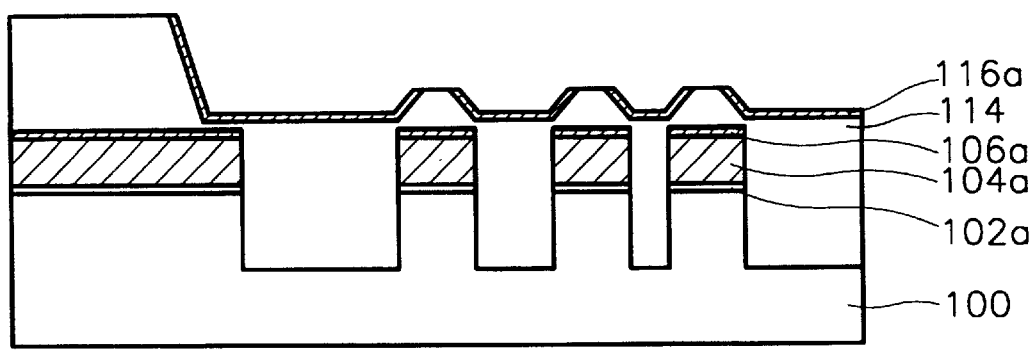

Referring now to FIG. 6, a mask pattern 116a is formed by performing a CMP process on the resultant structure where the mask layer 116 is formed. In particular, portions of the fourth insulating layer 114 and the mask layer 116 are removed by planarizing the portions where the protrusion 115 are formed. The mask pattern 116a is thereby formed, to expose portions of the fourth insulating layer 114 extending opposite active regions in the substrate.

Figure 7:
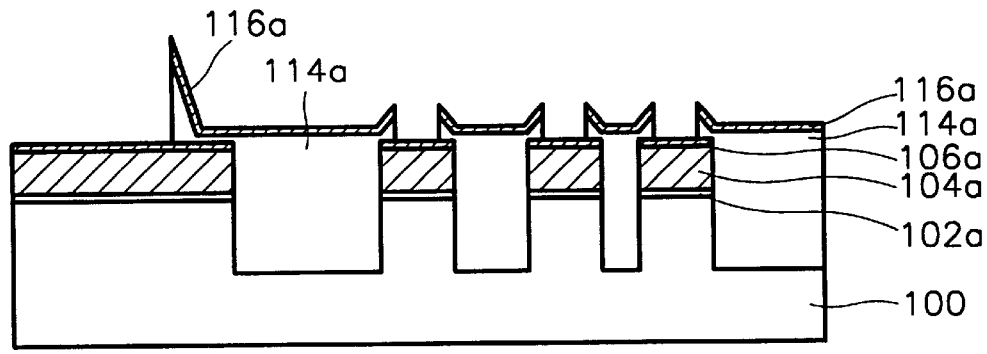

As illustrated by FIG. 7, the exposed portions of the fourth insulating layer 114 are then etched, using the mask pattern 116a as an etching mask, to form the fourth insulating layer pattern 114a.

Figure 8:
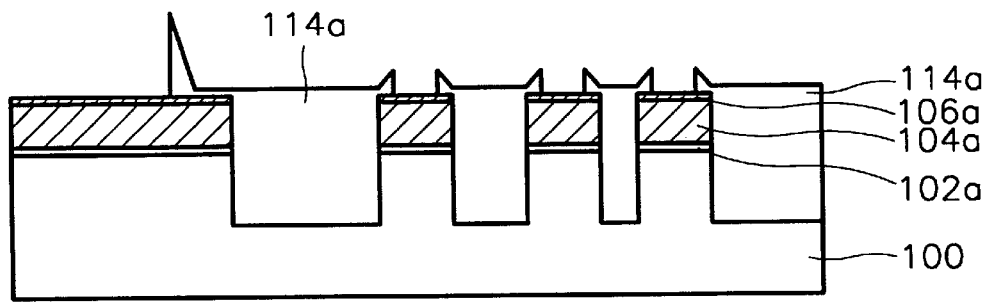

Referring to FIG. 8, the mask pattern 116a is removed by dry-etching or wet-etching, to completely expose the surface of the fourth insulating layer pattern 114a.

Figure 9:
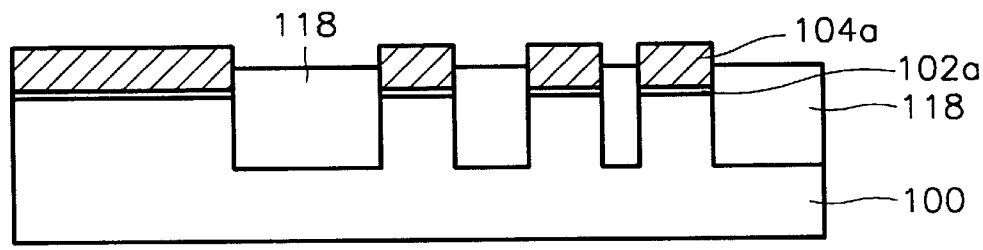

Referring to FIG. 9, the second insulating layer pattern 106a and the fourth insulating layer pattern 114a are then wet-etched, to form the isolation regions 118 in the trenches 112. At this time, the second insulating layer pattern 106a is completely removed, because it has a wet-etching rate higher than that of the fourth insulating layer pattern 114a.

Then, if necessary, a wet oxidation step for enhancing the isolation characteristics of the fourth insulating layer pattern 114a can be further performed.

Figure 10:
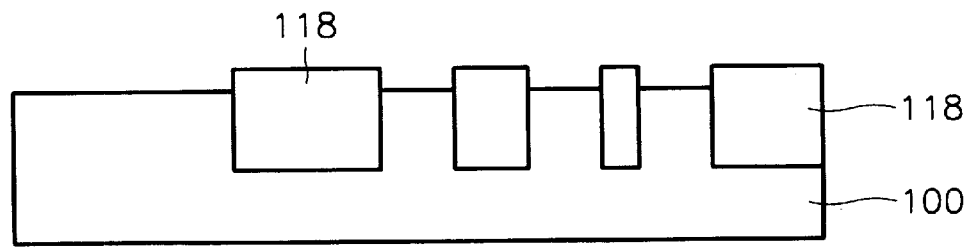

Referring to FIG. 10, the first insulating layer pattern 104a and the pad oxide layer pattern 102a are then removed to expose the trench isolation regions 118. Accordingly, trench isolation regions are formed in the semiconductor substrate 100.

According to the present invention, by using a plasma CVD method in which deposition and etching are simultaneously performed, an insulating layer is effectively buried in the trenches, to thereby isolate devices. Therefore, electrical isolation can be enhanced, and locally poor planarization is reduced to thereby improve global planarization. Also, a CMP process is preferably performed only once to form the isolation layers 118. The use of a single CMP process also reduces economic costs.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming trench isolation regions, comprising the steps of:

forming a trench in a semiconductor substrate having a surface thereon;

depositing an electrically insulating layer on the semiconductor substrate, to fill the trench; then forming a mask layer on the electrically insulating layer;

planarizing the mask layer to define a mask having openings therein that expose first portions of the electrically insulating layer extending opposite the surface;

etching the exposed first portions of the electrically insulating layer using the mask as an etching mask; and etching the mask and second portions of the electrically insulating layer extending opposite the mask, to define an electrically insulating region in the trench.

2. The method of claim 1, wherein said step of depositing an electrically insulating layer comprises depositing an electrically insulating layer by plasma chemical vapor deposition.

3. The method of claim 2, wherein said step of forming a mask layer comprises depositing a mask layer comprising polycrystalline silicon.

4. The method of claim 3, wherein said step of planarizing the mask layer comprises polishing the mask layer using chemical mechanical polishing.

5. The method of claim 2, wherein the plasma is selected from the group consisting of high density plasma and electron cyclotron resonance plasma.

6. The method of claim 1, wherein said step of forming a trench comprises forming a plurality of adjacent trenches in the substrate to define active regions therebetween; wherein said step of depositing an electrically insulating layer comprises conformally depositing an electrically insulating layer on the surface of the substrate and into the plurality of trenches to fill the trenches; and wherein said step of planarizing the mask layer comprises planarizing the mask layer to define a mask having openings therein that extend opposite the active regions.

7. The method of claim 6, wherein said step of forming a trench is preceded by the steps of:

forming a pad oxide layer on the surface of the substrate;

forming a silicon nitride layer on the pad oxide layer, opposite the surface;

forming a spin-on glass layer on the silicon nitride layer, opposite the pad oxide layer;

patterning the spin-on glass layer, silicon nitride layer and pad oxide layer to expose the surface of the substrate.

8. The method of claim 7, wherein said step of forming a trench comprises etching the exposed surface of the substrate to define at least one trench therein.

9. The method of claim 8, wherein said patterning step is preceded by the step of forming a sacrificial layer comprising a material selected from the group consisting of polymers, plasma TEOS and oxide, on the spin-on glass layer.

10. The method of claim 8, wherein said step of etching the exposed surface of the substrate comprises etching the sacrificial layer to expose the spin-on glass layer.

11. The method of claim 10, wherein said step of etching the second portions of the electrically insulating layer comprises etching the second portions of the electrically insulating layer using a wet etchant.

* * * * *